United States Patent
Jiang et al.

(10) Patent No.: US 10,629,109 B2
(45) Date of Patent: Apr. 21, 2020

(54) ARRAY SUBSTRATE, DISPLAY PANEL AND METHOD OF DRIVING DISPLAY PANEL

(71) Applicants: BOE Technology Group Co., Ltd., Beijing (CN); Beijing BOE Display Technology Co., Ltd., Beijing (CN)

(72) Inventors: Feng Jiang, Beijing (CN); Qian Wang, Beijing (CN); Duo Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 65 days.

(21) Appl. No.: 15/924,830

(22) Filed: Mar. 19, 2018

(65) Prior Publication Data
US 2019/0131324 A1 May 2, 2019

(30) Foreign Application Priority Data

Oct. 30, 2017 (CN) .......................... 2017 1 1043171

(51) Int. Cl.
*G09G 3/20* (2006.01)
*H01L 27/12* (2006.01)
(Continued)

(52) U.S. Cl.
CPC ............. *G09G 3/20* (2013.01); *G09G 3/3291* (2013.01); *G09G 3/3688* (2013.01);
(Continued)

(58) Field of Classification Search
CPC .... H01L 27/1244; G09G 3/20; G09G 3/3688; G09G 3/3291; G09G 2310/0297;
(Continued)

(56) References Cited

U.S. PATENT DOCUMENTS

| 6,917,368 B2 | 7/2005 | Credelle et al. |
| 7,248,271 B2 | 7/2007 | Credelle et al. |

(Continued)

FOREIGN PATENT DOCUMENTS

| CN | 100593187 C | 3/2010 |
| CN | 103472608 A | 12/2013 |

(Continued)

OTHER PUBLICATIONS

First Office Action, including Search Report, for Chinese Patent Application No. 201711043171.2, dated Sep. 3, 2019, 26 pages.

*Primary Examiner* — Premal R Patel
(74) *Attorney, Agent, or Firm* — Westman, Champlin & Koehler, P.A.

(57) ABSTRACT

Embodiments of the present disclosure provide an array substrate, a display panel and a method of driving the display panel. The array substrate includes: a plurality of pixel units arranged in an array and each including a plurality of sub-pixels; a plurality of gate lines extending in a first direction; and a plurality of data lines extending in a second direction crossing the first direction. Each of the pixel units is connected to one of the data lines, and the sub-pixels of the each of the pixel units are distributed on both sides of the one data line; and each of the pixel units is connected to three of the gate lines, and any one of the sub-pixels of the each of the pixel units is connected to one of the three gate lines.

20 Claims, 8 Drawing Sheets

(51) Int. Cl.
*G09G 3/3291* (2016.01)
*G09G 3/36* (2006.01)

(52) U.S. Cl.
CPC . *H01L 27/1244* (2013.01); *G09G 2300/0426* (2013.01); *G09G 2300/0443* (2013.01); *G09G 2300/0452* (2013.01); *G09G 2300/0465* (2013.01); *G09G 2310/0297* (2013.01)

(58) Field of Classification Search
CPC ... G09G 2300/0426; G09G 2300/0452; G09G 2300/0443; G09G 2300/0465
See application file for complete search history.

(56) References Cited

U.S. PATENT DOCUMENTS

| | | | |
|---|---|---|---|
| 9,613,577 B2 | 4/2017 | Hong et al. | |
| 9,691,319 B2 | 6/2017 | Chu-Ke et al. | |
| 9,825,064 B2 | 11/2017 | Dong et al. | |
| 10,102,788 B2 | 10/2018 | Yoon et al. | |
| 10,417,979 B2 | 9/2019 | Xu et al. | |
| 2004/0174375 A1 | 9/2004 | Credelle et al. | |
| 2005/0134600 A1* | 6/2005 | Credelle | G09G 3/3607 345/589 |
| 2009/0128458 A1* | 5/2009 | Kim | G09G 3/3233 345/76 |
| 2014/0204008 A1* | 7/2014 | Chu-Ke | G09G 3/2003 345/88 |
| 2015/0348481 A1* | 12/2015 | Hong | G09G 3/2003 345/690 |
| 2016/0189591 A1* | 6/2016 | Yoon | G09G 3/2003 345/690 |
| 2016/0196780 A1 | 7/2016 | Chu-Ke et al. | |
| 2017/0186386 A1 | 6/2017 | Hong et al. | |
| 2017/0213850 A1 | 7/2017 | Dong et al. | |
| 2017/0236474 A1 | 8/2017 | Xu et al. | |

FOREIGN PATENT DOCUMENTS

| | | |
|---|---|---|
| CN | 103529614 A | 1/2014 |
| CN | 104932137 A | 9/2015 |
| CN | 105137688 A | 12/2015 |
| CN | 105139813 A | 12/2015 |
| CN | 106205448 A | 12/2016 |

* cited by examiner

ARRAY SUBSTRATE, DISPLAY PANEL AND METHOD OF DRIVING DISPLAY PANEL

CROSS-REFERENCE TO RELATED APPLICATION

This application claims the benefit of Chinese Patent Application No. 201711043171.2 filed on Oct. 30, 2017, the whole disclosure of which is incorporated herein by reference.

BACKGROUND

1. Technical Field

Embodiments of the present disclosure relate to an array substrate, a display panel and a method of driving the display panel.

2. Description of the Related Art

Conventional displays, such as a liquid crystal display (LCD) or an organic light-emitting diode (OLED) display, all achieve a color display by synthesis of three primary colors (for example, red, green and blue).

When there are 3M sub-pixels in each row in a display having a resolution of N×M, 3M data lines needs to be disposed accordingly. With the increases of pixels per inch (PPI) and of the resolution of the display, the data lines become more and more accordingly. The number of output channels (one channel corresponds to one terminal connected to one data line) of a single source driver integrated circuit (IC) has been fabricated to reach the limit, so that a plurality of source driver ICs are needed to drive the data lines simultaneously, especially for a high-resolution screen in which more source driver ICs are needed to drive the data lines simultaneously. The more the number of the used source driver ICs is, the more the cost increases, and an increase in defective rate will also be caused.

SUMMARY

Embodiments of the present disclosure provide an array substrate comprising: a plurality of pixel units arranged in an array and each comprising a plurality of sub-pixels; a plurality of gate lines extending in a first direction; and a plurality of data lines extending in a second direction crossing the first direction, wherein each of the pixel units is connected to one of the data lines, and the sub-pixels of the each of the pixel units are distributed on both sides of the one data line; and each of the pixel units is connected to three of the gate lines, and any one of the sub-pixels of the each of the pixel units is connected to one of the three gate lines.

According to embodiments of the present disclosure, each of the pixel units comprises four sub-pixels, two of the four sub-pixels are located on one side of the one data line, and the other two of the four sub-pixels are located on the other side of the one data line.

According to embodiments of the present disclosure, each of the pixel units comprises one sub-pixel of a first color, one sub-pixel of a second color, and two sub-pixels of a third color; and the two sub-pixels of the third color are disposed diagonally or on a same side of the one data line, and are electrically connected to a same one of the gate lines.

According to embodiments of the present disclosure, a width of the sub-pixel of the third color in the first direction in which the gate line extends is less than a width of the sub-pixel of the first color or the sub-pixel of the second color in the first direction in which the gate line extends.

According to embodiments of the present disclosure, the width of the sub-pixel of the third color in the first direction in which the gate line extends is a half of the width of the sub-pixel of the first color or the sub-pixel of the second color in the first direction in which the gate line extends.

According to embodiments of the present disclosure, each of the pixel units comprises one sub-pixel of a first color, one sub-pixel of a second color, one sub-pixel of a third color, and one white sub-pixel; and the one sub-pixel of the third color and the one white sub-pixel are electrically connected to a same one of the gate lines.

According to embodiments of the present disclosure, a width of each of the white sub-pixel and the sub-pixel of the third color in the first direction in which the gate line extends is less than a width of the sub-pixel of the first color or the sub-pixel of the second color in the first direction in which the gate line extends.

According to embodiments of the present disclosure, the sub-pixel of the third color is a blue sub-pixel.

According to embodiments of the present disclosure, the sub-pixel of the third color is a blue sub-pixel.

According to embodiments of the present disclosure, each of the pixel units comprises three sub-pixels, two of the three sub-pixels are located on one side of the one data line, and the other one of the three sub-pixels is located on the other side of the one data line.

According to embodiments of the present disclosure, the sub-pixels of any one of the pixel units are respectively disposed between adjacent ones of the three gate lines connected to the one of the pixel units.

According to embodiments of the present disclosure, the three gate lines comprise a first gate line, a second gate line, and a third gate line; and the two sub-pixels of the third color in each of the pixel units are electrically connected to the second gate line located between the two sub-pixels of the third color.

According to embodiments of the present disclosure, the sub-pixel of the first color in each of the pixel units and the first gate line are located on one side of the second gate line in the second direction in which the data lines extend, and the sub-pixel of the first color in the each of the pixel units is connected to the first gate line; and the sub-pixel of the second color in each of the pixel units and the third gate line are located on the other side of the second gate line in the second direction in which the data line extends, and the sub-pixel of the second color in the each of the pixel units is connected to the third gate line.

According to embodiments of the present disclosure, the three gate lines comprise a first gate line, a second gate line, and a third gate line; and the sub-pixel of the third color and the white sub-pixel in each of the pixel units are electrically connected to the second gate line located between the sub-pixel of the third color and the white sub-pixel.

According to embodiments of the present disclosure, the sub-pixel of the first color in each of the pixel units and the first gate line are located on one side of the second gate line in the second direction in which the data lines extend, and the sub-pixel of the first color in the each of the pixel units is connected to the first gate line; and the sub-pixel of the second color in each of the pixel units and the third gate line are located on the other side of the second gate line in the second direction in which the data lines extend, and the sub-pixel of the second color in the each of the pixel units is connected to the third gate line.

According to embodiments of the present disclosure, the three gate lines comprise a first gate line, a second gate line, and a third gate line, and the second gate line is located between the first gate line and the third gate line; and the sub-pixel of the first color in each of the pixel units is connected to the first gate line, the sub-pixel of the second color in each of the pixel units is connected to the second gate line, and the sub-pixel of the third color and the white sub-pixel in each of the pixel units are electrically connected to the third gate line.

According to embodiments of the present disclosure, sub-pixels in one row of pixel units, arranged in the first direction, of the plurality of pixel units are arranged into two rows of sub-pixels along the first direction.

According to embodiments of the present disclosure, sub-pixels in one column of pixel units, arranged in the second direction, of the plurality of pixel units are arranged into two columns of sub-pixels along the second direction.

Embodiments of the present disclosure further provide a display panel comprising the abovementioned array substrate.

Embodiments of the present disclosure further provide a method of driving a display panel, wherein: the display panel comprises an array substrate, the array substrate comprises: a plurality of pixel units arranged in an array and each comprising a plurality of sub-pixels; a plurality of gate lines extending in a first direction; and a plurality of data lines extending in a second direction crossing the first direction, wherein each of the pixel units is connected to one of the data lines, and the sub-pixels of the each of the pixel units are distributed on both sides of the one data line; and each of the pixel units is connected to three of the gate lines, and any one of the sub-pixels of the each of the pixel units is connected to one of the three gate lines; wherein each of the pixel units comprises one sub-pixel of a first color, one sub-pixel of a second color, and two sub-pixels of a third color; and the two sub-pixels of the third color are disposed diagonally or on a same side of the one data line, and are electrically connected to a same one of the gate lines; the method comprising: inputting scanning signals to the gate lines line by line, and inputting data voltages through the data lines after the sub-pixels connected to the gate lines are turned on, wherein when the data voltages are inputted to the two sub-pixels of the third color in each of the pixel units, a sum of the data voltages across the two sub-pixels of the third color is a light emission voltage for the third color, required for displaying of the each of the pixel units.

BRIEF DESCRIPTION OF THE DRAWINGS

In order to describe technical solutions in embodiments of the present disclosure more clearly, accompanying drawings required for describing the embodiments will be simply explained as below. Apparently, the accompanying drawings for the following description are only some embodiments of the present disclosure. Those skilled in the art also could derive other accompanying drawings from these accompanying drawings without making a creative work.

DETAILED DESCRIPTION OF THE EMBODIMENTS

Figure 1:
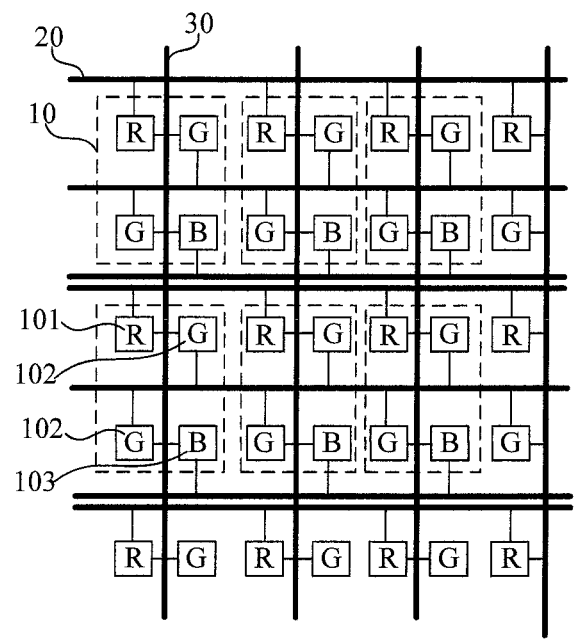
FIG. 1 is a schematic diagram showing an arrangement of sub-pixels in pixel units and a connection of the sub-pixels to gate lines and data lines on an array substrate according to an embodiment of the present disclosure.

A clear and complete description of technical solutions in embodiments of the present disclosure will be made as below in conjunction with the accompanying drawings in the embodiments of the present disclosure. Apparently, the described embodiments are some of the embodiments of the present disclosure rather than all of the embodiments of the present disclosure. All other embodiments derived by those skilled in the art based on the embodiments of the present disclosure without making a creative work shall fall into the protection scope of the present invention.

Embodiments of the present disclosure provide an array substrate. As shown in FIG. 1 to FIG. 8, the array substrate comprises: a plurality of pixel units 10 (as indicated by dashed boxes in the figures) arranged in an array and each comprising a plurality of sub-pixels; a plurality of gate lines 20 extending in a first direction; and a plurality of data lines 30 extending in a second direction crossing the first direction. Each of the pixel units 10 is connected to one of the data lines 30, and the sub-pixels of the each of the pixel units 10 are distributed on both sides of the one data line 30 and for example are all in the proximity of the one data line 30; and each of the pixel units 10 is connected to three of the gate lines 20, and any one of the sub-pixels of the each of the pixel units 10 is connected to one of the three gate lines 20.

According to embodiments of the present disclosure, one row of pixel units 10, along the first direction in which the gate line 20 extends, are connected to three gate lines 20. For example, if the first direction in which the gate line 20 extends is a horizontal direction, then a first row of pixel units 10 are connected to first, second and third gate lines 20, a second row of pixel units 10 are connected to fourth, fifth and sixth gate lines 20, a third row of pixel units 10 are connected to seventh, eighth and ninth gate lines 20, and so forth. Sub-pixels in one row of pixel units 10, arranged in the first direction, of the plurality of pixel units are arranged into two rows of sub-pixels along the first direction.

Similarly, one column of pixel units 10 along a second direction crossing the gate line 20 are connected to one data line 30. For example, the second direction is perpendicular to the gate line 20. For example, if the second direction perpendicular to the gate line 20 is a vertical direction, then a first column of pixel units 10 are connected to a first data line 30, a second column of pixel units 10 are connected to a second data line 30, a third column of pixel units 10 are connected to a third data line 30, and so forth. Sub-pixels in one column of pixel units, arranged in the second direction, of the plurality of pixel units are arranged into two columns of sub-pixels along the second direction.

According to embodiments of the present disclosure, the number of the sub-pixels in the pixel unit 10 may be determined according to a specific type of an array substrate as long as under the control of three gate lines 20 and one data line 30, each of the sub-pixels in the pixel unit 10 can emit light so that the pixel unit 10 displays an expected color.

According to embodiments of the present disclosure, one pixel unit 10 is connected to one data line 30. In other words, regardless of how many sub-pixels the pixel unit 10 comprises, the sub-pixels of the pixel unit 10 are connected to the same data line 30.

In order to facilitate electrical connection between the sub-pixels of the pixel unit 10 and the same data line 30, in the present disclosure, the sub-pixels of the pixel unit 10 are distributed on both sides of the data line 30 and are all in the proximity of the data line 30.

In addition, the number of the sub-pixels of the pixel unit 10 is greater than or equal to 3. Therefore, according to embodiments of the present disclosure, when there are a plurality of sub-pixels of the pixel unit 10 on one side of the data line 30, the plurality of sub-pixels are arranged along the second direction perpendicular to the gate line 20, so that the sub-pixels of each pixel unit 10 are distributed in columns along the second direction perpendicular to the gate line 20.

According to embodiments of the present disclosure, any one of the sub-pixels of each of the pixel units 10 is connected to one of the three gate lines 20. In other words, each sub-pixel of the pixel unit 10 is connected to one gate line 20, but there is no limitation that each sub-pixel is connected to a different gate line 20. In other words, for example, two sub-pixels may be connected to the same gate line 20.

Figure 9:
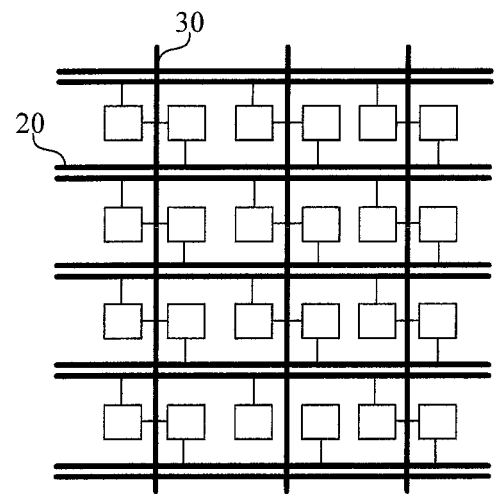
FIG. 9 is a schematic diagram of an array substrate having a dual-gate-line structure according to an embodiment of the present disclosure.

The embodiments of the present disclosure provide an array substrate. The number of the data lines 30 can be drastically decreased by connecting one pixel unit 10 to one data line 30, so that the number of the source driver integrated circuits (IC) is reduced, the cost is decreased, and a yield of products is raised. In addition, compared with the number of gate lines 20 of an array substrate having a dual-gate-line structure, i.e. an array substrate in which two gate lines 20 are disposed between adjacent rows of sub-pixels (as shown in FIG. 9), in the embodiments of the present disclosure, the number of the gate lines 20 can be reduced by about one quarter. With a resolution equivalent to that of the dual-gate-line array substrate, a charging time of each sub-pixel can be increased by decreasing the number of the gate lines 20, thereby achieving a more stable displaying effect. In addition, the sub-pixel may be set to have a rectangular shape, and the sub-pixels of each pixel unit 10 are distributed in columns along the second direction perpendicular to the gate line 20, thereby facilitating an increase of the number of the pixel units 10 along the first direction in which the gate line extends. As a result, the resolution can be raised.

According to embodiments of the present disclosure, as shown in FIG. 1 to FIG. 7, each of the pixel units 10 comprises four sub-pixels, two of the four sub-pixels are located on one side of a data line 30, and the other two of the four sub-pixels are located on the other side of the data line 30.

Since each of the pixel units 10 is connected to three gate lines 20, and comprises four sub-pixels, two of the four sub-pixels are connected to a same one of the three gate lines 20.

According to embodiments of the present disclosure, each of the pixel units 10 comprises one sub-pixel of a first color, one sub-pixel of a second color, and two sub-pixels of a third color; and the two sub-pixels of the third color are disposed diagonally or on a same side of the data line 30, and are electrically connected to a same one of the gate lines 20.

According to embodiments of the present disclosure, the first color, the second color, and the third color are three primary colors, for example, three primary colors of red, green, and blue, and of course, they may also be three primary colors of magenta, yellow, and cyan, or the like. The present disclosure is described based on the three primary colors of red, green, and blue.

According to embodiments of the present disclosure, referring to FIG. 1 to FIG. 4, the three gate lines 20 comprise a first gate line, a second gate line, and a third gate line; and the two sub-pixels of the third color in each of the pixel units 10 are electrically connected to the second gate line located between the two sub-pixels of the third color. For example, the sub-pixel of the first color in each of the pixel units 10 and the first gate line are located on one side of the second gate line in the second direction in which the data line 30 extends, and the sub-pixel of the first color in each of the pixel units is connected to the first gate line; and the sub-pixel of the second color in each of the pixel units 10 and the third gate line are located on the other side of the second gate line in the second direction in which the data line 30 extends, and the sub-pixel of the second color in each of the pixel units is connected to the third gate line.

Figure 5:
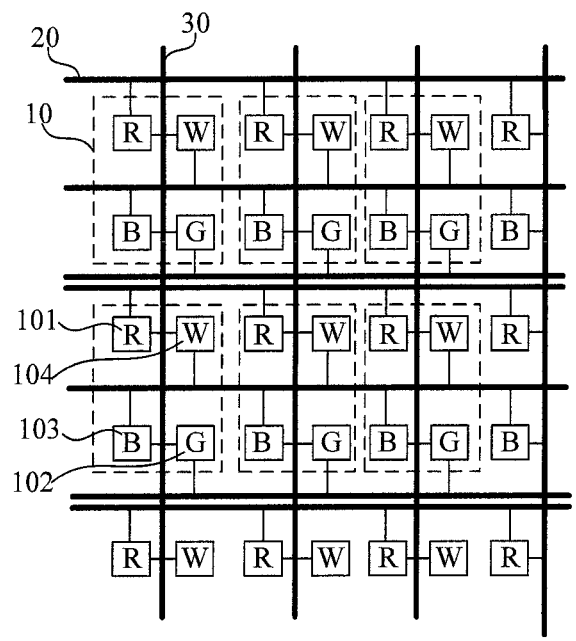
FIG. 5 is a schematic diagram showing an arrangement of sub-pixels in pixel units and a connection of the sub-pixels to gate lines and data lines on an array substrate according to yet another embodiment of the present disclosure.
Figure 6:
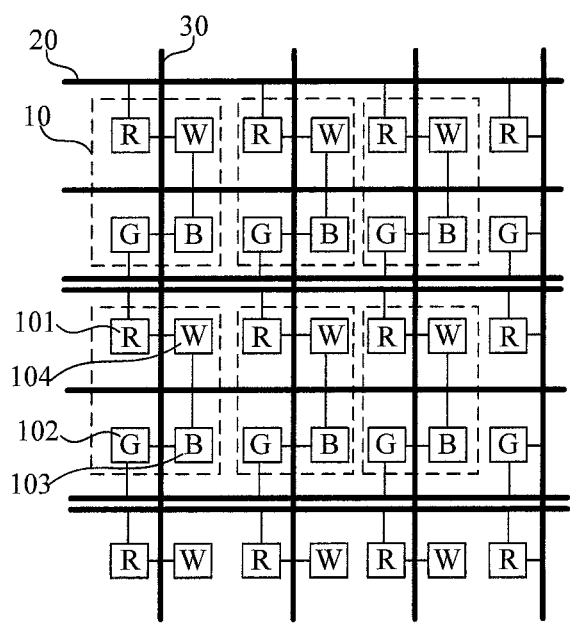
FIG. 6 is a schematic diagram showing an arrangement of sub-pixels in pixel units and a connection of the sub-pixels to gate lines and data lines on an array substrate according to a still further embodiment of the present disclosure.

According to embodiments of the present disclosure, referring to FIG. 5 to FIG. 6, the three gate lines 20 comprise a first gate line, a second gate line, and a third gate line; and the sub-pixel of the third color and the white sub-pixel in each of the pixel units 10 are electrically connected to the second gate line located between the sub-pixel of the third color and the white sub-pixel. For example, the sub-pixel of the first color in each of the pixel units 10 and the first gate line are located on one side of the second gate line in the second direction in which the data line extends, and the sub-pixel of the first color in each of the pixel units is connected to the first gate line; and the sub-pixel of the second color in each of the pixel units and the third gate line are located on the other side of the second gate line in the second direction in which the data line extends, and the sub-pixel of the second color in each of the pixel units is connected to the third gate line.

Figure 7:
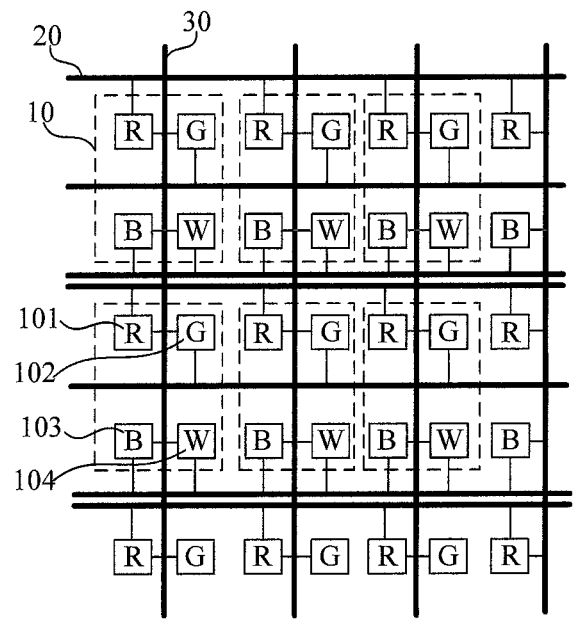
FIG. 7 is a schematic diagram showing an arrangement of sub-pixels in pixel units and a connection of the sub-pixels to gate lines and data lines on an array substrate according to a yet further embodiment of the present disclosure.

According to embodiments of the present disclosure, referring to FIG. 7, the three gate lines 20 comprise a first gate line, a second gate line, and a third gate line, and the second gate line is located between the first gate line and the third gate line; and the sub-pixel of the first color in each of the pixel units 10 is connected to the first gate line, the sub-pixel of the second color in each of the pixel units is connected to the second gate line, and the sub-pixel of the third color and the white sub-pixel in each of the pixel units are electrically connected to the third gate line. The sub-pixel of the first color and the sub-pixel of the second color are located between the first gate line and the second gate line, while the sub-pixel of the third color and the white sub-pixel are located between the second gate line and the third gate line.

Example 1

The sub-pixel of the first color may be a red sub-pixel, the sub-pixel of the second color may be a blue sub-pixel, and the sub-pixels of the third color may be green sub-pixels. As shown in FIG. 1, the red sub-pixel 101 and one of the green sub-pixels 102 in the pixel unit 10 are located on both sides of the data line 30 in the first direction in which the gate line 20 extends, the blue sub-pixel 103 and the other of the green sub-pixels 102 in the pixel unit 10 are also located on both sides of the data line 30 in the first direction in which the gate line 20 extends, the two green sub-pixels 102 may be disposed diagonally and are connected to a same one of the gate lines 20, and the red sub-pixel 101 and the blue sub-pixel 103 are also disposed diagonally and are each connected to one of the gate lines 20.

Example 2

Figure 2:
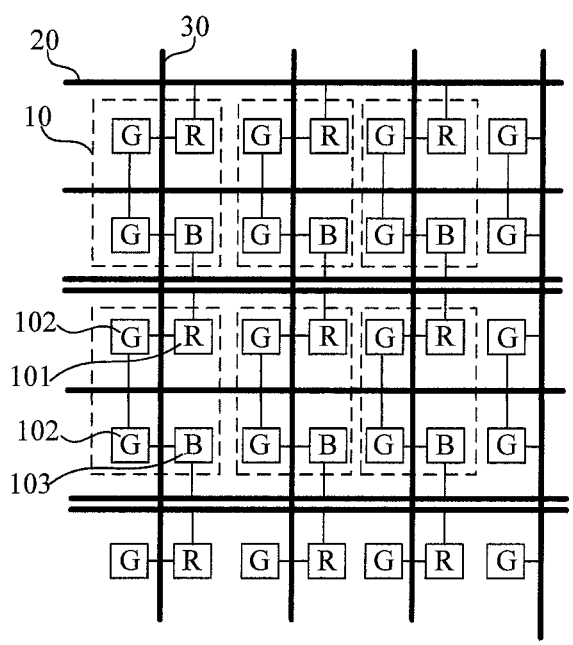
FIG. 2 is a schematic diagram showing an arrangement of sub-pixels in pixel units and a connection of the sub-pixels to gate lines and data lines on an array substrate according to another embodiment of the present disclosure.

The sub-pixel of the first color may be a red sub-pixel, the sub-pixel of the second color may be a blue sub-pixel, and the sub-pixels of the third color may be green sub-pixels. As shown in FIG. 2, the red sub-pixel 101 and one of the green sub-pixels 102 in the pixel unit 10 are located on both sides of the data line 30 in the first direction in which the gate line 20 extends, the blue sub-pixel 103 and the other of the green sub-pixels 102 in the pixel unit 10 are also located on both sides of the data line 30 in the first direction in which the gate line 20 extends, the two green sub-pixels 102 are located on a same side of the data line 30 and are connected to a same one of the gate lines 20, and the red sub-pixel 101 and the blue sub-pixel 103 are located on the other side of the data line 30 and are each connected to one of the gate lines 20.

Example 3

Figure 3:
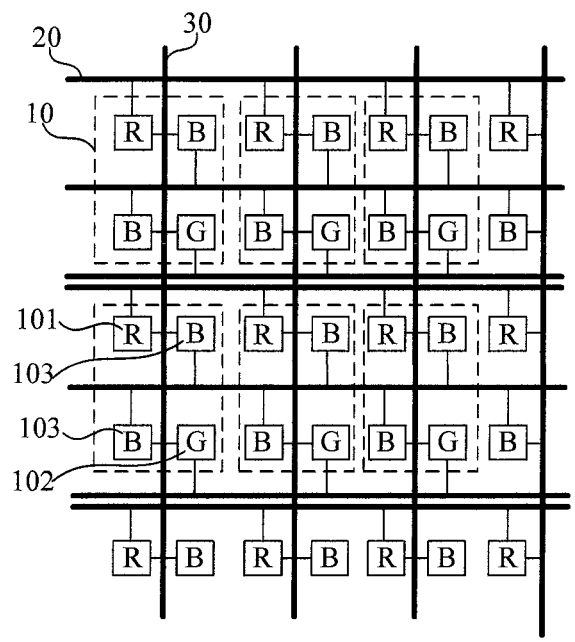
FIG. 3 is a schematic diagram showing an arrangement of sub-pixels in pixel units and a connection of the sub-pixels to gate lines and data lines on an array substrate according to a further embodiment of the present disclosure.

The sub-pixel of the first color may be a red sub-pixel, the sub-pixel of the second color may be a green sub-pixel, and the sub-pixels of the third color may be blue sub-pixels. As shown in FIG. 3, the red sub-pixel 101 and one of the blue sub-pixels 103 in the pixel unit 10 are located on both sides of the data line 30 in the first direction in which the gate line 20 extends, the green sub-pixel 102 and the other of the blue sub-pixels 103 in the pixel unit 10 are also located on both sides of the data line 30 in the first direction in which the gate line 20 extends, the two blue sub-pixels 103 may be disposed diagonally and are connected to a same one of the gate lines 20, and the red sub-pixel 101 and the green sub-pixel 102 are also disposed diagonally and are each connected to one of the gate lines 20.

Example 4

Figure 4:
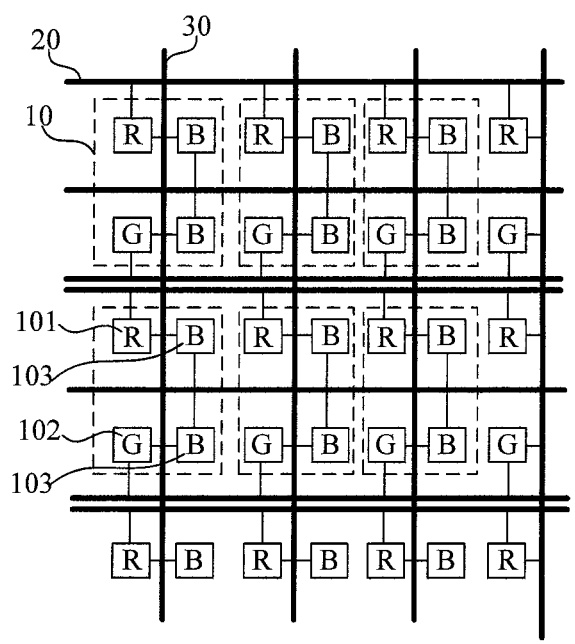
FIG. 4 is a schematic diagram showing an arrangement of sub-pixels in pixel units and a connection of the sub-pixels to gate lines and data lines on an array substrate according to still another embodiment of the present disclosure.

The sub-pixel of the first color may be a red sub-pixel, the sub-pixel of the second color may be a green sub-pixel, and the sub-pixels of the third color may be blue sub-pixels. As shown in FIG. 4, the red sub-pixel 101 and one of the blue sub-pixels 103 in the pixel unit 10 are located on both sides of the data line 30 in the first direction in which the gate line 20 extends, the green sub-pixel 102 and the other of the blue sub-pixels 103 in the pixel unit 10 are also located on both sides of the data line 30 in the first direction in which the gate line 20 extends, the two blue sub-pixels 103 are located on a same side of the data line 30 and are connected to a same one of the gate lines 20, and the red sub-pixel 101 and the green sub-pixel 102 are located on the other side of the data line 30 and are each connected to one of the gate lines 20.

Example 5

The sub-pixel of the first color may be a green sub-pixel, the sub-pixel of the second color may be a blue sub-pixel, and the sub-pixels of the third color may be red sub-pixels. The green sub-pixel 102 and one of the red sub-pixels 101 in the pixel unit 10 are located on both sides of the data line 30 in the first direction in which the gate line 20 extends, the blue sub-pixel 103 and the other of the red sub-pixels 101 in the pixel unit 10 are also located on both sides of the data line 30 in the first direction in which the gate line 20 extends, the two red sub-pixels 101 may be disposed diagonally and are connected to a same one of the gate lines 20, and the blue sub-pixel 103 and the green sub-pixel 102 are also disposed diagonally and are each connected to one of the gate lines 20.

Example 6

The sub-pixel of the first color may be a green sub-pixel, the sub-pixel of the second color may be a blue sub-pixel, and the sub-pixels of the third color may be red sub-pixels. The green sub-pixel 102 and one of the red sub-pixels 101 in the pixel unit 10 are located on both sides of the data line 30 in the first direction in which the gate line 20 extends, the blue sub-pixel 103 and the other of the red sub-pixels 101 in the pixel unit 10 are also located on both sides of the data line 30 in the first direction in which the gate line 20 extends, the two red sub-pixels 101 are located on a same side of the data line 30 and are connected to a same one of the gate lines 20, and the blue sub-pixel 103 and the green sub-pixel 102 are located on the other side of the data line 30 and are each connected to one of the gate lines 20.

Figure 10:
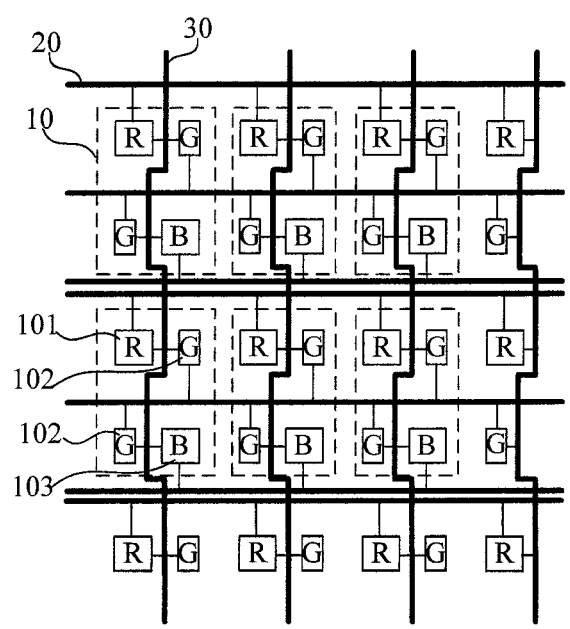
FIG. 10 is a schematic diagram showing an arrangement of sub-pixels in pixel units and a connection of the sub-pixels to gate lines and data lines on an array substrate according to another embodiment of the present disclosure.

According to embodiments of the present disclosure, referring to FIG. 10, a width of the sub-pixel of the third color in the first direction in which the gate line 20 extends is less than a width of the sub-pixel of the first color or the sub-pixel of the second color in the first direction in which the gate line 20 extends.

The widths of the sub-pixel of the first color and the sub-pixel of the second color in the first direction in which the gate line 20 extends may be equal to each other. Lengths of the sub-pixel of the first color, the sub-pixel of the second color and the sub-pixel of the third color in the second direction perpendicular to the gate line 20 may be equal to one another.

Figure 11:
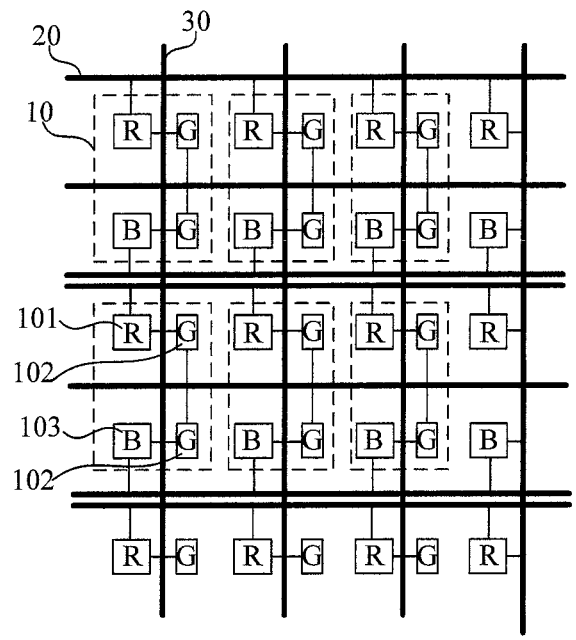
FIG. 11 is a schematic diagram showing an arrangement of sub-pixels in pixel units and a connection of the sub-pixels to gate lines and data lines on an array substrate according to a further embodiment of the present disclosure.

Specifically, when the sub-pixel of the third color is a green sub-pixel 102, as shown in FIG. 10 and FIG. 11, a width of the green sub-pixel 102 in the first direction in which the gate line 20 extends is set to be less than a width of the red sub-pixel 101 or the blue sub-pixel 103 in the first direction in which the gate line 20 extends.

Figure 12:
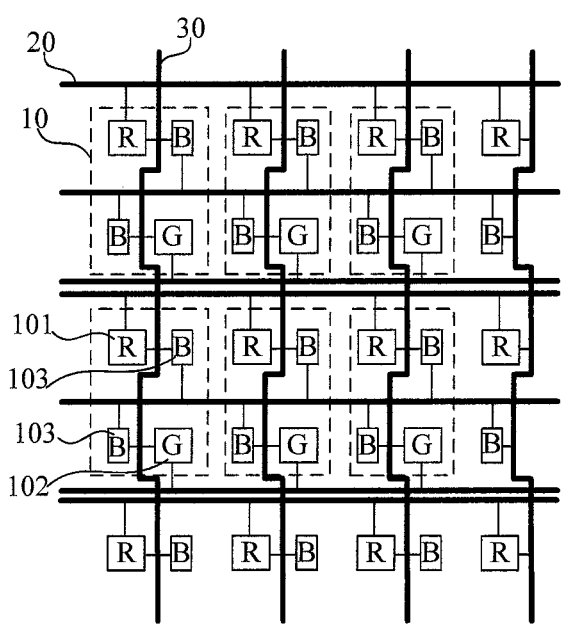
FIG. 12 is a schematic diagram showing an arrangement of sub-pixels in pixel units and a connection of the sub-pixels to gate lines and data lines on an array substrate according to an embodiment of the present disclosure.
Figure 13:
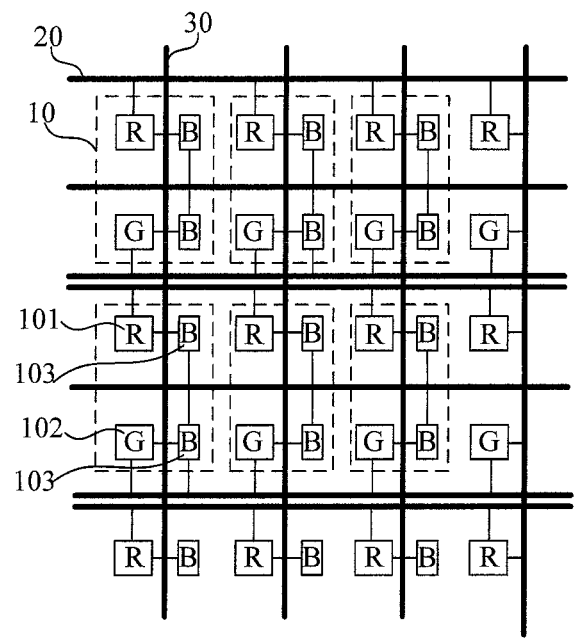
FIG. 13 is a schematic diagram showing an arrangement of sub-pixels in pixel units and a connection of the sub-pixels to gate lines and data lines on an array substrate according to a still further embodiment of the present disclosure.

When the sub-pixel of the third color is a blue sub-pixel 103, as shown in FIG. 12 and FIG. 13, a width of the blue sub-pixel 103 in the first direction in which the gate line 20 extends is set to be less than a width of the red sub-pixel 101 or the green sub-pixel 102 in the first direction in which the gate line 20 extends.

When the sub-pixel of the third color is a red sub-pixel 101, a width of the red sub-pixel 101 in the first direction in which the gate line 20 extends may also be set to be less than a width of the blue sub-pixel 103 or the green sub-pixel 102 in the first direction in which the gate line 20 extends.

Compared with one array substrate in which the sub-pixel of the first color, the sub-pixel of the second color and the sub-pixel of the third color have the same width and length, an array substrate having the same size as the one array substrate can be fabricated to have a higher PPI by reducing the width of the sub-pixel of the third color.

In the case where the PPI is increased, since the data lines 30 shown in FIG. 10 and FIG. 12 need to be zigzag bent, there is a high risk of occurrence of breakage of wirings. Therefore, according to an example of the present disclosure, the two sub-pixels of the third color in each of the pixel units 10 are disposed on a same side of the data line 30 (as shown in FIG. 11 and FIG. 13), and in the first direction in which the gate line 20 extends, a width of the sub-pixel of the third color is less than a width of the sub-pixel of the first color or the sub-pixel of the second color.

According to embodiments of the present disclosure, the width of the sub-pixel of the third color in the first direction in which the gate line 20 extends is a half of the width of the sub-pixel of the first color or the sub-pixel of the second color in the first direction in which the gate line 20 extends.

In this way, in addition to technological realizability, the PPI can be further increased.

A decrease in percentage of blue light is not easily perceived in consideration of insensitivity of human eyes to the blue light. Therefore, according to embodiments of the present disclosure, when the width of the sub-pixel of the third color in the first direction in which the gate line 20 extends is decreased, the sub-pixel of the third color is a blue sub-pixel 103.

According to embodiments of the present disclosure, referring to FIG. 5, FIG. 6, and FIG. 7, each of the pixel units 10 may comprise one sub-pixel of a first color, one sub-pixel of a second color, one sub-pixel of a third color, and one white sub-pixel; and the one sub-pixel of the third color and the one white sub-pixel are electrically connected to a same one of the gate lines 20.

As an example in which the sub-pixel of the first color is a blue sub-pixel 103, as shown in FIG. 5, the white sub-pixel 104 and the red sub-pixel 101 in the pixel unit 10 are located on both sides of the data line 30 in the first direction in which the gate line 20 extends, the blue sub-pixel 103 and the green sub-pixel 102 in the pixel unit 10 are also located on both sides of the data line 30 in the first direction in which the gate line 20 extends, the white sub-pixel 104 and the blue sub-pixel 103 may be disposed diagonally and are connected to a same one of the gate lines 20, and the red sub-pixel 101 and the green sub-pixel 102 are also disposed diagonally and are each connected to one of the gate lines 20.

Alternatively, as shown in FIG. 6, the white sub-pixel 104 and the red sub-pixel 101 in the pixel unit 10 are located on both sides of the data line 30 in the first direction in which the gate line 20 extends, the blue sub-pixel 103 and the green sub-pixel 102 in the pixel unit 10 are also located on both sides of the data line 30 in the first direction in which the gate line 20 extends, the white sub-pixel 104 and the blue sub-pixel 103 are located on a same side of the data line 30 and are connected to a same one of the gate lines 20, and the red sub-pixel 101 and the green sub-pixel 102 are located on the other side of the data line 30 and are each connected to one of the gate lines 20.

Alternatively, as shown in FIG. 7, the red sub-pixel 101 and the green sub-pixel 102 in the pixel unit 10 are located on both sides of the data line 30 in the first direction in which the gate line 20 extends and are each connected to one of the gate lines 20, and the blue sub-pixel 103 and the white sub-pixel 104 in the pixel unit 10 are also located on both sides of the data line 30 in the first direction in which the gate line 20 extends and are connected to a same one of the gate lines 20.

Of course, the sub-pixel of the first color may also be a red sub-pixel 101 or a green sub-pixel 102. For specific embodiments, the case where the sub-pixel of the first color is a blue sub-pixel 103 may be referred to, and they are no longer described for the sake of brevity.

In the embodiments of the present disclosure, a contrast of the display apparatus to which the array substrate is applied can be increased and the power consumption is reduced by disposing the white sub-pixel 104 in the pixel unit 10. In addition, the white sub-pixel 104 and the sub-pixel of the third color are connected to the same gate line 20, so that normal displaying will not be adversely affected.

Figure 14:
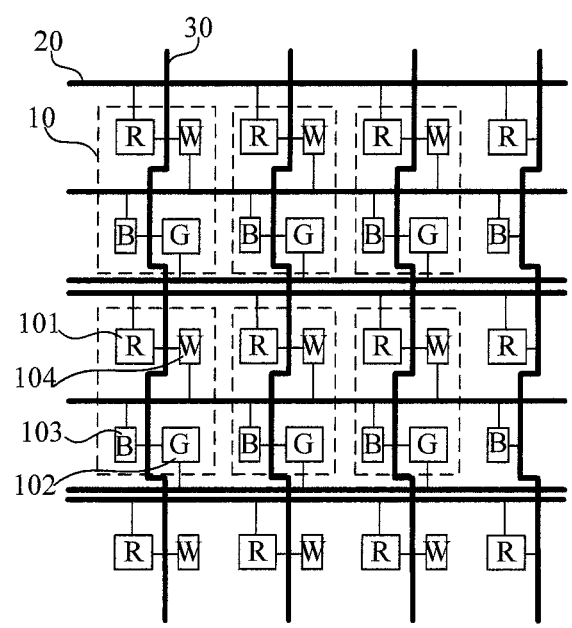
FIG. 14 is a schematic diagram showing an arrangement of sub-pixels in pixel units and a connection of the sub-pixels to gate lines and data lines on an array substrate according to a yet further embodiment of the present disclosure.
Figure 15:
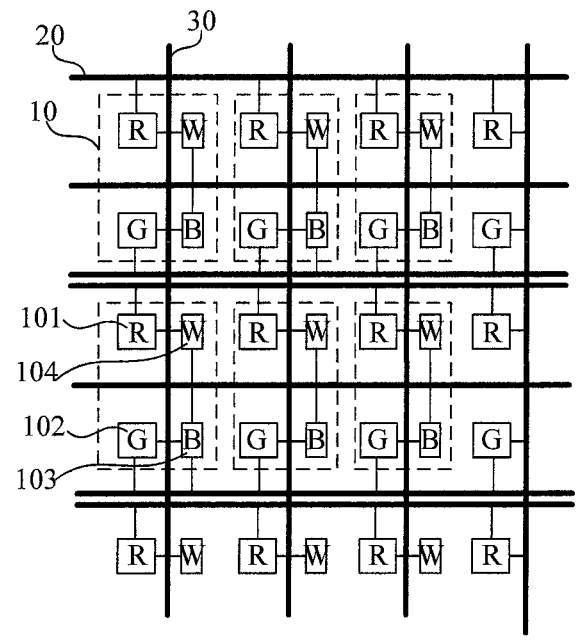
FIG. 15 is a schematic diagram showing an arrangement of sub-pixels in pixel units and a connection of the sub-pixels to gate lines and data lines on an array substrate according to still another embodiment of the present disclosure.
Figure 16:
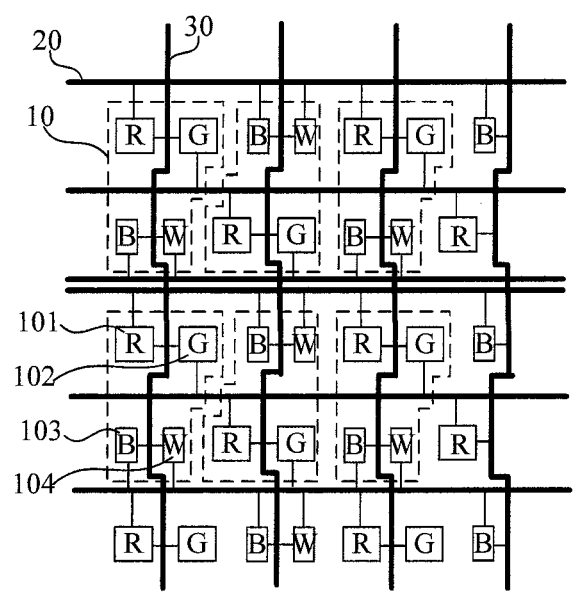
FIG. 16 is a schematic diagram showing an arrangement of sub-pixels in pixel units and a connection of the sub-pixels to gate lines and data lines on an array substrate according to yet another embodiment of the present disclosure.

According to embodiments of the present disclosure, referring to FIG. 14 to FIG. 16, a width of each of the white sub-pixel 104 and the sub-pixel of the third color in the first direction in which the gate line 20 extends is less than a width of the sub-pixel of the first color or the sub-pixel of the second color in the first direction in which the gate line 20 extends.

The widths of the sub-pixel of the first color and the sub-pixel of the second color in the first direction in which the gate line 20 extends may be equal to each other, and the widths of the white sub-pixel 104 and the sub-pixel of the third color in the first direction in which the gate line 20 extends may be equal to each other. Lengths of the sub-pixel of the first color, the sub-pixel of the second color, the sub-pixel of the third color, and the white sub-pixel 104 in the second direction in which the data line 30 extends may be equal to one another.

As an example in which the sub-pixel of the third color is a blue sub-pixel 103, as shown in FIG. 14 to FIG. 16, a width of each of the white sub-pixel 104 and the blue sub-pixel 103 in the first direction in which the gate line 20 extends is set to be less than a width of the red sub-pixel 101 or the green sub-pixel 102 in the first direction in which the gate line 20 extends.

Of course, the sub-pixel of the first color may also be a red sub-pixel 101 or a green sub-pixel 102. For specific embodiments, the case where the sub-pixel of the first color is a blue sub-pixel 103 may be referred to, and they are no longer described for the sake of brevity.

Compared with one array substrate in which the sub-pixel of the first color, the sub-pixel of the second color, the sub-pixel of the third color, and the white sub-pixel 104 have the same width and length, an array substrate having the same size as the one array substrate can be fabricated to have a higher PPI by reducing the widths of the sub-pixel of the third color and the white sub-pixel 104.

In the case where the PPI is increased, since the data lines 30 shown in FIG. 14 and FIG. 16 need to be zigzag bent, there is a high risk of occurrence of breakage of wirings. Therefore, according to an example of the present disclosure, the sub-pixel of the third color and the white sub-pixel 104 in each of the pixel units 10 are disposed on a same side of the data line 30 (as shown in FIG. 15), and in the first direction in which the gate line 20 extends, a width of each of the sub-pixel of the third color and the white sub-pixel 104 is less than a width of the sub-pixel of the first color or the sub-pixel of the second color.

According to embodiments of the present disclosure, the width of each of the sub-pixel of the third color and the white sub-pixel 104 in the first direction in which the gate line 20 extends is a half of the width of the sub-pixel of the first color or the sub-pixel of the second color in the first direction in which the gate line 20 extends.

In this way, in addition to technological realizability, the PPI can be further increased.

A decrease in percentage of blue light is not easily perceived in consideration of insensitivity of human eyes to the blue light. Therefore, according to embodiments of the present disclosure, when the width of the sub-pixel of the third color in the first direction in which the gate line 20 extends is decreased, the sub-pixel of the third color is a blue sub-pixel 103.

Figure 8:
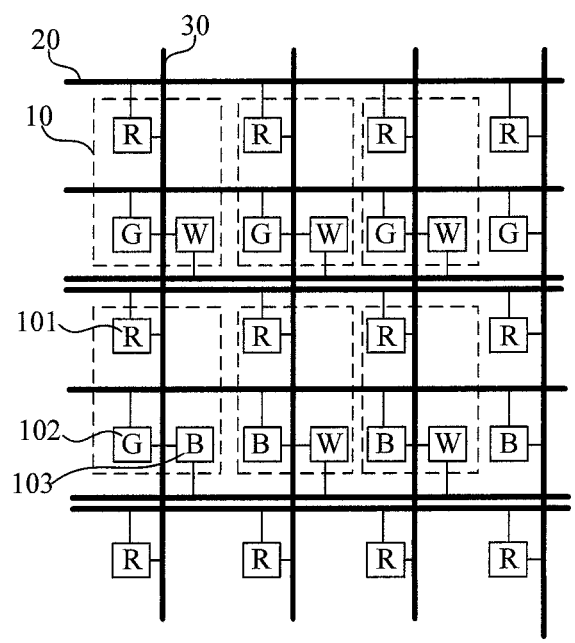
FIG. 8 is a schematic diagram showing an arrangement of sub-pixels in pixel units and a connection of the sub-pixels to gate lines and data lines on an array substrate according to an embodiment of the present disclosure.

According to embodiments of the present disclosure, as shown in FIG. 8, each of the pixel units 10 comprises three sub-pixels, two of the three sub-pixels are located on one side of the data line 30, and the other one of the three sub-pixels is located on the other side of the data line 30.

According to embodiments of the present disclosure, as shown in FIG. 1 to FIG. 8, the sub-pixels of any one of the pixel units 10 are respectively disposed between adjacent ones of the three gate lines 20 connected to the one of the pixel units 10.

In this way, the gate lines 20 can be distributed uniformly so that complexity of technology is reduced, and a yield is raised. In addition, the number of the gate lines 20 in the array substrate according to the present disclosure is less than the number of gate lines 20 in an array substrate having a dual-gate-line structure. Therefore, the array substrate according to the present disclosure is more favorable to achieving of a narrow frame when the gate lines 20 are driven in a GOA (Gate Driver on Array) manner.

Embodiments of the present disclosure also provide a display panel comprising the abovementioned array substrate.

The display panel may be a liquid crystal display panel, an organic light-emitting diode (OLED) display panel, and the like.

Embodiments of the present disclosure further provide a method of driving a display panel. The display panel comprises an array substrate. As shown in FIG. 1 to FIG. 4, the array substrate comprises: a plurality of pixel units 10 arranged in an array and each comprising a plurality of sub-pixels; a plurality of gate lines 20 extending in a first direction; and a plurality of data lines 30 extending in a second direction crossing the first direction. Each of the pixel units 10 is connected to one of the data lines 30, and the sub-pixels of the each of the pixel units 10 are distributed on both sides of the one data line 30 and for example are all in the proximity of the data line 30; and each of the pixel units 10 is connected to three of the gate lines 20, and any one of the sub-pixels of the each of the pixel units 10 is connected to one of the three gate lines 20. Each of the pixel units 10 comprises one sub-pixel of a first color, one sub-pixel of a second color, and two sub-pixels of a third color; and the two sub-pixels of the third color are disposed diagonally or on a same side of the one data line 30, and are electrically connected to a same one of the gate lines 20.

According to embodiments of the present disclosure, the method comprises: inputting scanning signals to the gate lines 20 line by line, and inputting data voltages through the data lines 30 after the sub-pixels connected to the gate lines 20 are turned on. When the data voltages are inputted to the two sub-pixels of the third color in each of the pixel units 10, a sum of the data voltages across the two sub-pixels of the third color is a light emission voltage for the third color, required for displaying of each of the pixel units 10.

For example, the sub-pixel of the first color may be a red sub-pixel 101, the sub-pixel of the second color may be a blue sub-pixel 103, the sub-pixels of the third color may be green sub-pixels 102, and a width of the sub-pixel of the third color in the first direction in which the gate line 20 extends is equal to a width of the sub-pixel of the first color or the sub-pixel of the second color in the first direction in which the gate line 20 extends. Referring to FIG. 1, after a scanning signal (for example a high-level signal) is inputted to a first gate line 20, red sub-pixels 101 in a first row of sub-pixels begin to be charged. After a period of time, a voltage of the first gate line 20 is pulled down, while a scanning signal is inputted to a second gate line 20. Green sub-pixels 102 in the first row of sub-pixels and a second row of sub-pixels begin to be charged. Since one pixel unit 10 has two green sub-pixels 102, in this case, a voltage signal of the data line 30 needs to be decreased. The voltage of the data line 30 is about a half of a light emission voltage for the green, required for displaying of the pixel unit 10. After a period of time, a voltage of the second gate line 20 is pulled down, while a scanning signal is inputted to a third gate line 20. Blue sub-pixels 103 in the second row of sub-pixels begin to be charged. Similarly, all the other sub-pixels are charged.

It should be noted that the relevant description of the abovementioned array substrate may be referred to for the relevant description of the array substrate in the present embodiments of the disclosure, and it is no longer described herein for the sake of brevity.

In addition, in the case where the width of the sub-pixel of the third color in the first direction in which the gate line 20 extends is a half of the width of the sub-pixel of the first color or the sub-pixel of the second color in the first direction in which the gate line 20 extends, the voltage signal of the data line 30 need not be reduced, while a light emission voltage for the green, required for displaying is inputted to the data line 30.

The embodiments of the present disclosure provide an array substrate, a display panel and a method of driving the display panel. The number of the data lines can be drastically decreased by connecting one pixel unit to one data line, so that the number of the source driver ICs is reduced, the cost is decreased, and a yield of products is raised. In addition, compared with the number of gate lines of an array substrate having a dual-gate-line structure, i.e. an array substrate in which two gate lines are disposed between adjacent rows of sub-pixels, in the embodiments of the present disclosure, the number of the gate lines can be reduced by about one quarter. With a resolution equivalent to that of the dual-gate-line array substrate, charging time of each sub-pixel can be increased by decreasing the number of the gate lines, thereby achieving a more stable displaying effect. In addition, the sub-pixel may be set to have a rectangular shape, and in the present disclosure, the sub-pixels of each pixel unit are distributed in columns along the second direction perpendicular to the gate line, thereby facilitating an increase of the number of the pixel units along the first direction in which the gate line extends. As a result, the resolution can be raised.

The above embodiments are only used to explain the present disclosure, and should not be construed to limit the present disclosure. It will be appreciated by those skilled in the art that various changes and modifications may be made therein without departing from the spirit and scope of the present invention, the scope of which is defined in the appended claims and their equivalents.

What is claimed is:

1. An array substrate, comprising:
a plurality of pixel units arranged in an array and each comprising a plurality of sub-pixels;
a plurality of gate lines extending in a first direction; and
a plurality of data lines extending in a second direction crossing the first direction,
wherein each of the pixel units is connected to one of the data lines, and the sub-pixels of the each of the pixel units are distributed on both sides of the one data line;
wherein each of the pixel units is connected to three of the gate lines, and any one of the sub-pixels of the each of the pixel units is connected to one of the three gate lines, each of the three gate lines is connected to at least one sub-pixel of the each of the pixel units; and
wherein each of the plurality of data lines is connected to one column of pixel units of the plurality of pixel units, every three gate lines of the plurality of gate lines are connected to one row of pixel units of the plurality of pixel units, and two gate lines of the plurality of gate lines are disposed between every two adjacent rows of pixel units of the plurality of pixel units.

2. The array substrate of claim 1, wherein:
each of the pixel units comprises four sub-pixels, two of the four sub-pixels are located on one side of the one data line, and the other two of the four sub-pixels are located on the other side of the one data line.

3. The array substrate of claim 2, wherein:
each of the pixel units comprises one sub-pixel of a first color, one sub-pixel of a second color, and two sub-pixels of a third color; and
the two sub-pixels of the third color are disposed diagonally or on a same side of the one data line, and are electrically connected to a same one of the gate lines.

4. The array substrate of claim 3, wherein:
a width of the sub-pixel of the third color in the first direction in which the gate line extends is less than a width of the sub-pixel of the first color or the sub-pixel of the second color in the first direction in which the gate line extends.

5. The array substrate of claim 4, wherein:
the width of the sub-pixel of the third color in the first direction in which the gate line extends is a half of the width of the sub-pixel of the first color or the sub-pixel of the second color in the first direction in which the gate line extends.

6. The array substrate of claim 4, wherein:
the sub-pixel of the third color is a blue sub-pixel.

7. The array substrate of claim 3, wherein:
the three gate lines comprise a first gate line, a second gate line, and a third gate line; and
the two sub-pixels of the third color in each of the pixel units are electrically connected to the second gate line located between the two sub-pixels of the third color.

8. The array substrate of claim 7, wherein:
the sub-pixel of the first color in each of the pixel units and the first gate line are located on one side of the second gate line in the second direction in which the data lines extend, and the sub-pixel of the first color in the each of the pixel units is connected to the first gate line; and
the sub-pixel of the second color in each of the pixel units and the third gate line are located on the other side of the second gate line in the second direction in which the data line extends, and the sub-pixel of the second color in the each of the pixel units is connected to the third gate line.

9. The array substrate of claim 2, wherein:
each of the pixel units comprises one sub-pixel of a first color, one sub-pixel of a second color, one sub-pixel of a third color, and one white sub-pixel; and
the one sub-pixel of the third color and the one white sub-pixel are electrically connected to a same one of the gate lines.

10. The array substrate of claim 9, wherein:
a width of each of the white sub-pixel and the sub-pixel of the third color in the first direction in which the gate line extends is less than a width of the sub-pixel of the first color or the sub-pixel of the second color in the first direction in which the gate line extends.

11. The array substrate of claim 10, wherein:
the sub-pixel of the third color is a blue sub-pixel.

12. The array substrate of claim 9, wherein:
the three gate lines comprise a first gate line, a second gate line, and a third gate line; and
the sub-pixel of the third color and the white sub-pixel in each of the pixel units are electrically connected to the second gate line located between the sub-pixel of the third color and the white sub-pixel.

13. The array substrate of claim 12, wherein:
the sub-pixel of the first color in each of the pixel units and the first gate line are located on one side of the second gate line in the second direction in which the data lines extend, and the sub-pixel of the first color in the each of the pixel units is connected to the first gate line; and
the sub-pixel of the second color in each of the pixel units and the third gate line are located on the other side of the second gate line in the second direction in which the data lines extend, and the sub-pixel of the second color in the each of the pixel units is connected to the third gate line.

14. The array substrate of claim 9, wherein:
the three gate lines comprise a first gate line, a second gate line, and a third gate line, and the second gate line is located between the first gate line and the third gate line; and
the sub-pixel of the first color in each of the pixel units is connected to the first gate line, the sub-pixel of the second color in each of the pixel units is connected to the second gate line, and the sub-pixel of the third color and the white sub-pixel in each of the pixel units are electrically connected to the third gate line.

15. The array substrate of claim 1, wherein:
each of the pixel units comprises three sub-pixels, two of the three sub-pixels are located on one side of the one data line, and the other one of the three sub-pixels is located on the other side of the one data line.

16. The array substrate of claim 1, wherein:
the sub-pixels of any one of the pixel units are respectively disposed between adjacent ones of the three gate lines connected to the one of the pixel units.

17. The array substrate of claim 1, wherein:
sub-pixels in one row of pixel units, arranged in the first direction, of the plurality of pixel units are arranged into two rows of sub-pixels along the first direction.

18. The array substrate of claim 1, wherein:
sub-pixels in one column of pixel units, arranged in the second direction, of the plurality of pixel units are arranged into two columns of sub-pixels along the second direction.

19. A display panel, comprising:
the array substrate according to claim 1.

20. A method of driving a display panel, wherein:
the display panel comprises an array substrate comprising: a plurality of pixel units arranged in an array and each comprising a plurality of sub-pixels; a plurality of gate lines extending in a first direction; and a plurality of data lines extending in a second direction crossing the first direction, wherein each of the pixel units is connected to one of the data lines, and the sub-pixels of the each of the pixel units are distributed on both sides of the one data line; each of the pixel units is connected to three of the gate lines, and any one of the sub-pixels of the each of the pixel units is connected to one of the three gate lines, each of the three gate lines is connected to at least one sub-pixel of the each of the pixel units; and each of the plurality of data lines is connected to one column of pixel units of the plurality of pixel units, every three gate lines of the plurality of gate lines are connected to one row of pixel units of the plurality of pixel units, and two gate lines of the plurality of gate lines are disposed between every two adjacent rows of pixel units of the plurality of pixel units; wherein each of the pixel units comprises one sub-pixel of a first color, one sub-pixel of a second color, and two sub-pixels of a third color; and the two sub-pixels of the third color are disposed diagonally or on a same side of the one data line, and are electrically connected to a same one of the gate lines,
the method comprising:
inputting scanning signals to the gate lines line by line, and inputting data voltages through the data lines after the sub-pixels connected to the gate lines are turned on,
wherein when the data voltages are inputted to the two sub-pixels of the third color in each of the pixel units, a sum of the data voltages across the two sub-pixels of the third color is a light emission voltage for the third color, required for displaying of the each of the pixel units.

* * * * *